(12) United States Patent
Watamura et al.

(10) Patent No.: US 10,831,234 B1
(45) Date of Patent: Nov. 10, 2020

(54) PORTABLE INFORMATION DEVICE

(71) Applicant: LENOVO (SINGAPORE) PTE. LTD., Singapore (SG)

(72) Inventors: Kenji Watamura, Yokohama (JP); Takehito Yamauchi, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 16/749,734

(22) Filed: Jan. 22, 2020

(30) Foreign Application Priority Data

Aug. 27, 2019 (JP) ................. 2019-154929

(51) Int. Cl.
| | |
|---|---|
| G06F 1/16 | (2006.01) |
| H05K 5/00 | (2006.01) |
| H05K 5/03 | (2006.01) |
| H05K 5/02 | (2006.01) |

(52) U.S. Cl.
CPC ......... G06F 1/1601 (2013.01); H05K 5/0017 (2013.01); H05K 5/0086 (2013.01); H05K 5/0226 (2013.01); H05K 5/03 (2013.01); *G06F 2200/1612* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,971,032 B2* | 3/2015 | Griffin | .................. | G06F 1/1652 361/679.27 |
| 9,204,565 B1* | 12/2015 | Lee | .................. | E05D 3/022 |
| 9,697,941 B2* | 7/2017 | Lee | .................. | G02F 1/13 |
| 10,001,811 B1* | 6/2018 | Watamura | .................. | G06F 1/1616 |
| 10,067,536 B1* | 9/2018 | Watamura | .................. | G06F 1/1626 |
| 10,082,827 B2* | 9/2018 | Yamauchi | .................. | G06F 1/1681 |
| 10,185,355 B2* | 1/2019 | Watamura | .................. | G06F 1/1641 |
| 10,228,722 B2* | 3/2019 | Watamura | .................. | G06F 1/1683 |
| 10,386,886 B2* | 8/2019 | Yamauchi | .................. | G06F 1/1616 |
| 10,409,332 B2* | 9/2019 | Mizoguchi | ............ | G06F 1/1683 |
| 10,416,710 B2* | 9/2019 | Mizoguchi | ............ | G06F 1/1637 |
| 10,481,634 B2* | 11/2019 | Mizoguchi | ............ | G06F 1/1637 |
| 10,620,668 B2* | 4/2020 | Park | ...................... | G06F 1/1652 |
| 10,678,299 B2* | 6/2020 | Jung | ..................... | G06F 1/1641 |

(Continued)

FOREIGN PATENT DOCUMENTS

JP 2018112833 A 7/2018

*Primary Examiner* — Lisa Lea-Edmonds
(74) *Attorney, Agent, or Firm* — Shimokaji IP

(57) ABSTRACT

The portable information device includes: a display whose back surface is supported on respective front surfaces of first and second support plates; and an adhesive member that adheres to the front surfaces of the first and second support plates and the back surface of the display and fastens them together. In the portable information device, an area that overlaps with at least a folding area includes a weak adhesive section in which an adhesive force of the adhesive member between the first and second support plates and the display is reduced to be lower than the other section or a non-adhesive section that does not adhere to at least either the first and second support plates or the display. The portable information device further includes a magnet provided below the back surface of the display and in a position that overlaps with the folding area. The magnet can attract a magnetic body.

9 Claims, 8 Drawing Sheets

(56) References Cited

U.S. PATENT DOCUMENTS

| | | | | |
|---|---|---|---|---|
| 2014/0071101 A1* | 3/2014 | Kim | ...................... | G09G 3/3611 |
| | | | | 345/204 |
| 2014/0126121 A1* | 5/2014 | Griffin | ................ | H04M 1/0216 |
| | | | | 361/679.01 |
| 2018/0196467 A1* | 7/2018 | Watamura | ............. | G06F 1/1683 |
| 2018/0196468 A1* | 7/2018 | Watamura | ............. | G06F 1/1652 |
| 2018/0196469 A1* | 7/2018 | Yamauchi | ............. | G06F 1/1616 |
| 2018/0335799 A1* | 11/2018 | Yamauchi | ............. | G06F 1/1681 |
| 2019/0146556 A1* | 5/2019 | Mizoguchi | ............ | G06F 1/1637 |
| | | | | 361/679.27 |
| 2019/0196543 A1* | 6/2019 | Mizoguchi | ............ | G06F 1/1637 |
| 2019/0196544 A1* | 6/2019 | Mizoguchi | ............ | G06F 1/1683 |
| 2019/0305238 A1* | 10/2019 | Shin | ...................... | H01L 27/323 |
| 2020/0089273 A1* | 3/2020 | Watamura | ............. | G06F 1/1643 |

\* cited by examiner

PORTABLE INFORMATION DEVICE

FIELD OF THE INVENTION

The present invention relates to a portable information device with turnable chassis.

BACKGROUND OF THE INVENTION

In recent years, portable information devices such as a tablet PC and a smartphone that include a touch-panel liquid crystal display but no physical keyboard have rapidly been in widespread use. While this type of portable information device desirably has a large display when in use, a small display is desirable when not in use. Accordingly, there has been proposed a portable information device that uses a flexible display, such as an organic electroluminescence (EL) display, thereby enabling not only a chassis but also the display to be folded (see, for example, Japanese Unexamined Patent Application Publication No. 2018-112833).

SUMMARY OF THE INVENTION

In a configuration according to Japanese Unexamined Patent Application Publication No. 2018-112833, a sheet-like member, such as metal foil, is bonded to a top surface of a pair of right and left support plates, and the display is supported on the surface of the sheet-like member. At this time, a non-adhesive area is provided in a portion between the sheet-like member and the support plates corresponding to a folding portion of the support plates, and this allows the folding motion of the support plates.

Incidentally, such adhesion of the support plates and the sheet-like member is generally made with double-sided tape. Then, the portion corresponding to the folding portion is not provided with double-sided tape, and thereby the non-adhesive area is formed. Thus, when a chassis is opened, a folding portion of the display and its surroundings lift up from the support plates, and something like a line or a streak may appear on the surface of the display. This is likely to cause reduction in the quality of external appearance and the visibility.

The present invention has been made in view of the above-described problems of the conventional technology, and is intended to provide a portable information device that makes it possible to improve the quality of external appearance and the visibility of a display.

A portable information device according to a first aspect of the present invention is a portable information device that includes: a first chassis member; a second chassis member relatively turnably connected to the first chassis member; a first support plate fastened to the first chassis member; a second support plate that is fastened to the second chassis member and provided adjacent to the first support plate; a display having a back surface is supported on respective front surfaces of the first support plate and the second support plate, the display including a folding area that is folded when the first chassis member and the second chassis member turn relatively (i.e., foldably fold towards one another; and an adhesive member that adheres to the respective front surfaces of the first support plate and the second support plate and the back surface of the display, and fastens the first support plate and the second support plate and the display together. An area that overlaps with at least the folding area includes a weak adhesive section in which an adhesive force of the adhesive member between the respective front surfaces of the first support plate and the second support plate and the back surface of the display is reduced to be lower than another section or a non-adhesive section that does not adhere to at least either the respective front surfaces of the first support plate and the second support plate or the back surface of the display. The display includes a magnetic body in a position that overlaps with at least the folding area. The portable information device further includes a magnet provided below the back surface of the display and in a position that overlaps with the folding area, the magnet being able to attract the magnetic body.

According to such a configuration, the area that overlaps with at least the folding area includes the weak adhesive section that adheres to the support plates and the display with a lower adhesive force than the other section or the non-adhesive section that does not adhere to at least either the support plates or the display. Thus, the display can make a smooth folding motion. Furthermore, the portable information device includes the magnet below the display and in the position that overlaps with at least the folding area. Thus, the magnet can attract the magnetic body on the display side when the display is opened. As a result, creases or uplift in the folding area is suppressed, and therefore the quality of external appearance and the visibility of the display are improved.

It may be configured that when the portable information device is in an operable form in which the first chassis member and the second chassis member are on substantially the same plane, the magnet attracts the magnetic body and pulls the display to the side of the first support plate and the second support plate; and when the portable information device is in a storage form in which the first chassis member and the second chassis member are folded until they come face-to-face, and the display is folded, the magnet is disposed in a position farther away from the magnetic body than when the portable information device is in the operable form. Then, when the portable information device is in the operable form, the magnet more certainly attracts the magnetic body of the display, and the occurrence of creases, etc. can be suppressed. Furthermore, when the portable information device is in the storage form, the magnet is away from the display, which prevents the magnet from hampering the smooth folding motion of the display.

The magnet may be configured to be disposed on a back surface of at least either the first support plate or the second support plate.

At least a portion of the magnet may be configured to be embedded in at least either the first support plate or the second support plate.

Furthermore, it may be configured that the portable information device further includes a spine member provided to stretch between an inner surface of the first chassis member and an inner surface of the second chassis member so as to cover a gap formed between respective adjacent first edges of the first chassis member and the second chassis member when the portable information device is in the storage form, and one end of the spine member is non-slidably fixed to the inner surface of the second chassis member so that the spine member is able to slide in a direction from the second chassis member to the first chassis member along the inner surface of the first chassis member, and then the magnet is provided on the spine member.

The magnetic body may be configured of a rolled metallic sheet-like member. Then, the sheet-like member is made thinner, and has magnetism.

The sheet-like member may be made of stainless steel. Then, the sheet-like member exerts a high effect of assisting the folding motion of the display.

The sheet-like member may be configured to extend over an entire surface of the display. This can prevent the thickness of the display from being non-uniform.

The magnet may be disposed in a position near at least both ends of the folding area in a longitudinal direction.

The above-described aspect of the present invention can improve the quality of external appearance and the visibility of the display.

DETAILED DESCRIPTION OF THE INVENTION

Preferred embodiments of a portable information device according to the present invention will be described in detail below with reference to accompanying drawings.

Figure 1:
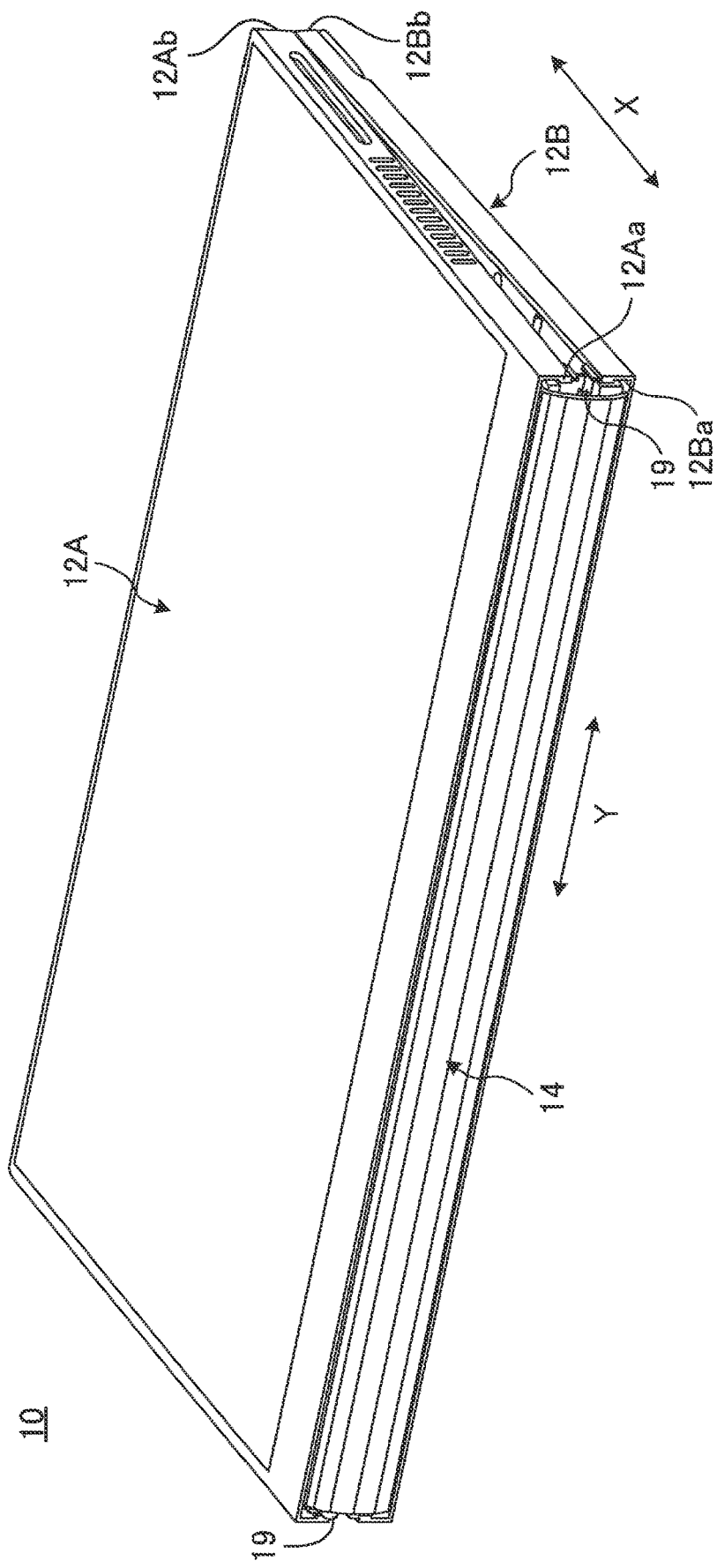
FIG. 1 is a perspective view showing a state where a portable information device according to an embodiment is closed and in a storage form.
Figure 2:
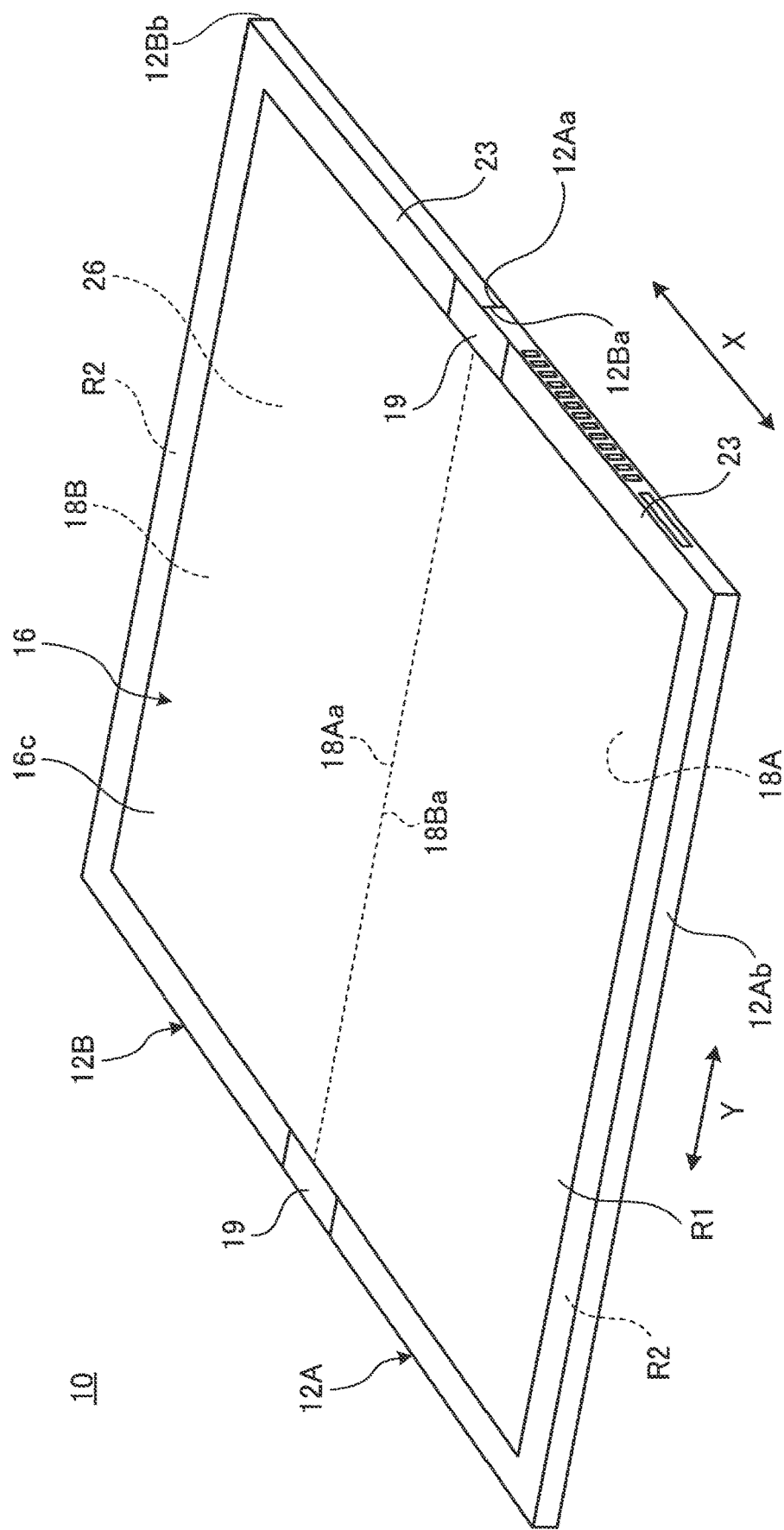
FIG. 2 is a perspective view schematically showing a state where the portable information device shown in FIG. 1 is open and in an operable form.
Figure 3:
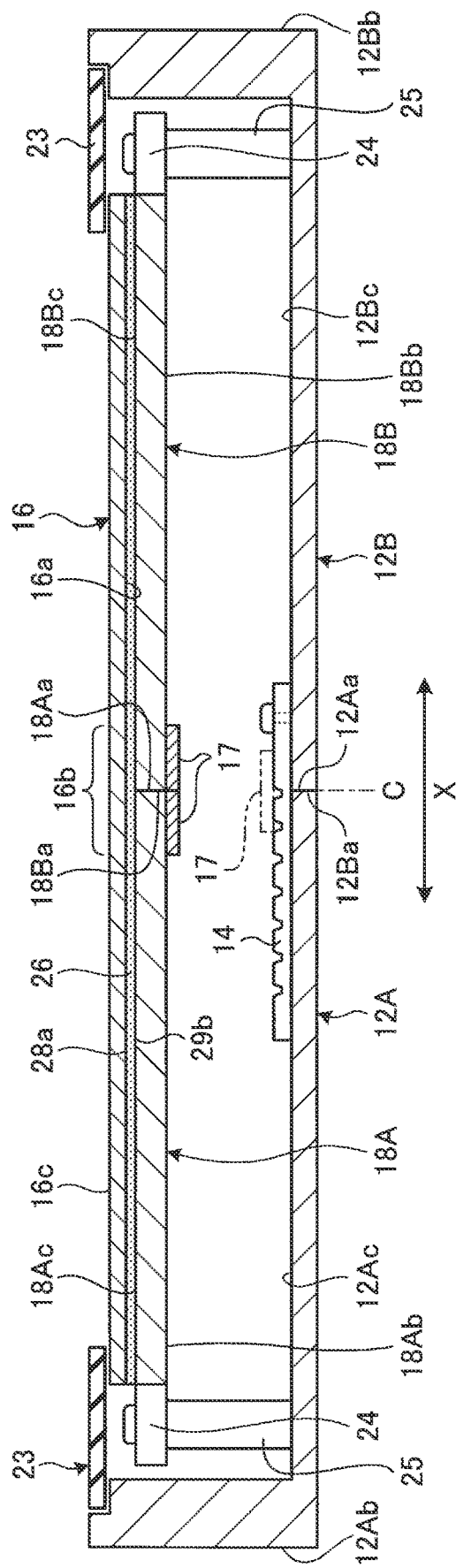
FIG. 3 is a cross-sectional side view schematically showing an internal structure of the portable information device shown in FIG. 2.

FIG. 1 is a perspective view showing a state where a portable information device 10 according to an embodiment is closed and in a storage form. FIG. 2 is a perspective view schematically showing a state where the portable information device 10 shown in FIG. 1 is open and in an operable form. FIG. 3 is a cross-sectional side view schematically showing an internal structure of the portable information device 10 shown in FIG. 2.

As shown in FIGS. 1 and 2, the portable information device 10 includes first and second chassis members 12A and 12B, a spine member 14, and a display 16. The portable information device 10 in the present embodiment is a tablet PC that can be folded in two like a book. Examples of the portable information device 10 may include a cell-phone, a smartphone, an electronic notebook, a handheld game console, etc.

The chassis members 12A and 12B are each a rectangular plate-like member with side walls standing on its three sides other than a side corresponding to the spine member 14. The chassis members 12A and 12B include, for example, a plate of metal, such as stainless steel, magnesium, or aluminum, or a fiber-reinforced resin plate including reinforced fiber such as carbon fiber. The display 16 is provided so as to extend over respective inner surfaces 12Ac and 12Bc of the chassis members 12A and 12B. The display 16 is supported on the inner surfaces 12Ac and 12Bc through first and second support plates 18A and 18B.

The chassis members 12A and 12B are disposed adjacent to each other. The chassis members 12A and 12B are connected through a pair of hinge mechanisms 19 and 19 provided on both ends of first edges 12Aa and 12Ba that are adjacent edges of the chassis members 12A and 12B. The hinge mechanisms 19 connect between the chassis members 12A and 12B so that the chassis members 12A and 12B can be folded in the storage form shown in FIG. 1 and unfolded in the operable form shown in FIG. 2. In the operable form, the chassis members 12A and 12B are disposed on substantially the same plane. In the storage form, the chassis members 12A and 12B are folded to a position where they come face-to-face with each other. An alternate long and short dash line C shown in FIG. 3 indicates a folding center C that is the center of the folding motion of the chassis members 12A and 12B. The first edges 12Aa and 12Ba of the chassis members 12A and 12B on the side of the spine member 14 are a hinge-side end. Second edges 12Ab and 12Bb of the chassis members 12A and 12B on the opposite side to the side of the spine member 14 are an open end.

The hinge mechanisms 19 are disposed, for example, on both longitudinal (Y-direction) ends of the first edges 12Aa and 12Ba of the chassis members 12A and 12B, and are located outside of the outer periphery of the display 16. The portable information device 10 in the present embodiment has a configuration in which the turning center of the chassis members 12A and 12B through the hinge mechanisms 19 coincides with the middle of a front surface 16c of the display 16.

As for the portable information device 10, hereinafter, as shown in FIGS. 1 and 2, a direction from the spine member 14 located in the middle to the second edges 12Ab and 12Bb is referred to as an X direction, and a direction along a longitudinal direction of the spine member 14 is referred to as a Y direction.

The display 16 is a touch-panel flexible display. For example, the display 16 is a highly flexible organic EL display having a paper structure. The display 16 is opened/closed in accordance with the opening/closing motion of the chassis members 12A and 12B. A bezel member 23 is provided on the outer periphery of the front surface 16c of the display 16. The bezel member 23 covers a non-display area (an inactive area) R2 of the outer periphery of the front surface 16c of the display 16 other than a display area (an active area) R1.

Figure 4A:
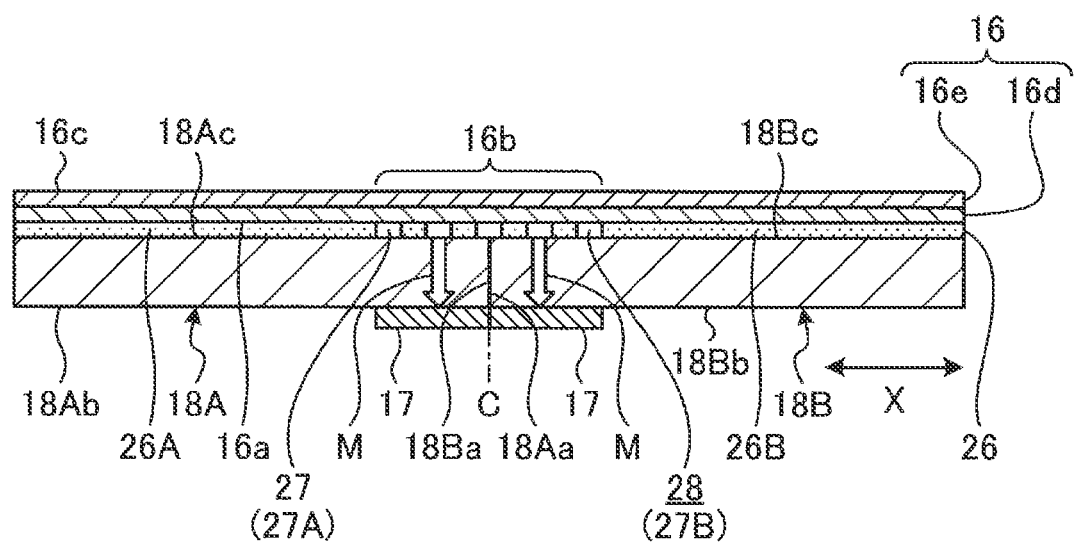
FIG. 4A is a cross-sectional side view schematically showing a configuration of a display, a magnet, an adhesive member, and support plates when in the operable form.

The display 16 is an assembly of parts stacked in layers, and includes, for example, a touch panel as a top layer, a display unit as an upper layer, a sheet-like member 16d (see FIG. 4A) as a lower layer, a cover film as a bottom layer, etc. In FIG. 4A, etc., as a cross-section structure of the display 16, the touch panel and the display unit are collectively shown as a panel unit 16e, and an illustration of the cover film located beneath the sheet-like member 16*d* is omitted. The cover film may as well be removed.

The sheet-like member 16*d* is an assist member for causing the display 16 to make a folding motion along a desired folding trajectory. The sheet-like member 16*d* is a thin stainless steel sheet formed by rolling out stainless steel. The sheet-like member 16*d* is a magnetic body (a ferromagnetic body) magnetized by being subjected to rolling. The sheet-like member 16*d* can be attracted by a magnet 17 disposed below a back surface 16*a* of the display 16. The sheet-like member 16*d* in the present embodiment extends over the entire surface of the display 16 (see FIG. 4A). This easily prevents the thickness of the display 16 from being non-uniform. However, the sheet-like member 16*d* only has to be provided at least in a position that overlaps with a folding area 16*b*. The thickness of the sheet-like member 16*d* is not particularly limited; for example, the sheet-like member 16*d* has a thickness of several tens of micrometers or about 100 μm to 200 μm. The sheet-like member 16*d* may be made of a metallic material other than stainless steel as long as the sheet-like member 16*d* can appropriately assist the folding motion of the display 16, and includes a magnetic body.

For example, as shown in FIG. 3, the display 16 is positioned and fastened to the chassis members 12A and 12B through attachment pieces 24 provided so as to project from respective outer peripheral end surfaces of the support plates 18A and 18B. The plurality of attachment pieces 24 is provided at appropriate points on the outer peripheries of the support plates 18A and 18B other than adjacent first edges 18Aa and 18Ba. The attachment pieces 24 are screwed to, for example, bosses 25 provided on the inner surfaces 12Ac and 12Bc. Thus, the support plates 18A and 18B are attached to the inner surfaces 12Ac and 12Bc of the chassis members 12A and 12B, respectively.

In a chassis internal space between the chassis members 12A and 12B and the support plates 18A and 18B, various semiconductor chips, such as a circuit board and a CPU, and various components, such as a communication module, a battery device, and a cooling device, are installed and fixed.

The spine member 14 is formed of a flexible, thin plate-like member, and serves as a spine when the portable information device 10 is folded. The spine member 14 is provided to stretch between the inner surfaces 12Ac and 12Bc of the chassis members 12A and 12B so as to cover a gap between the first edges 12Aa and 12Ba from the inside. As shown in FIG. 1, when the portable information device 10 is in the storage form, the first edges 12Aa and 12Ba of the chassis members 12A and 12B are largely separated from each other, and there is a gap between them. The spine member 14 covers this gap between the first edges 12Aa and 12Ba, thereby preventing exposure of the display 16 and various components inside.

As shown in FIG. 3, for example, one end of the spine member 14 is non-slidably fixed to the inner surface 12Bc of the second chassis member 12B by screw fixation or the like, and thus the spine member 14 can slide in the X direction along the inner surface 12Ac of the first chassis member 12A. Thus, the spine member 14 slides as if to follow the opening/closing motion of the chassis members 12A and 12B, and covers the gap between the first edges 12Aa and 12Ba when the portable information device 10 is in the storage form.

Subsequently, a configuration example of the support plates 18A and 18B is described. As shown in FIG. 3, the support plates 18A and 18B are each a thin plate-like member. The support plates 18A and 18B are plates that support the display 16. The back surface 16*a* of the display 16 is fastened to front surfaces 18Ac and 18Bc of the support plates 18A and 18B with an adhesive member 26. The support plates 18A and 18B are supported by the chassis members 12A and 12B, respectively, and are opened and closed like a book centering on the folding center C.

The support plates 18A and 18B include, for example, a plate of metal, such as stainless steel, or a fiber-reinforced resin plate including carbon fiber or the like. When in the operable form, the adjacent first edges 18Aa and 18Ba of the support plates 18A and 18B are in contact with each other (see FIG. 4A). When in the storage form, the first edges 18Aa and 18Ba of the support plates 18A and 18B are separated from each other (see FIG. 4B).

Figure 4B:
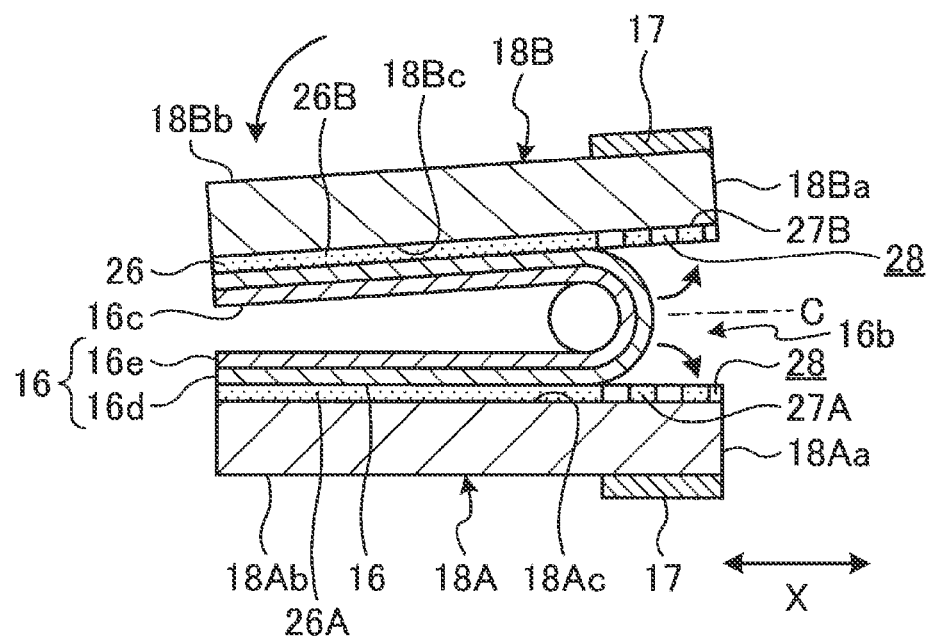
FIG. 4B is a cross-sectional side view schematically showing a configuration of the display, the magnet, the adhesive member, and the support plates when in the storage form.
Figure 5:
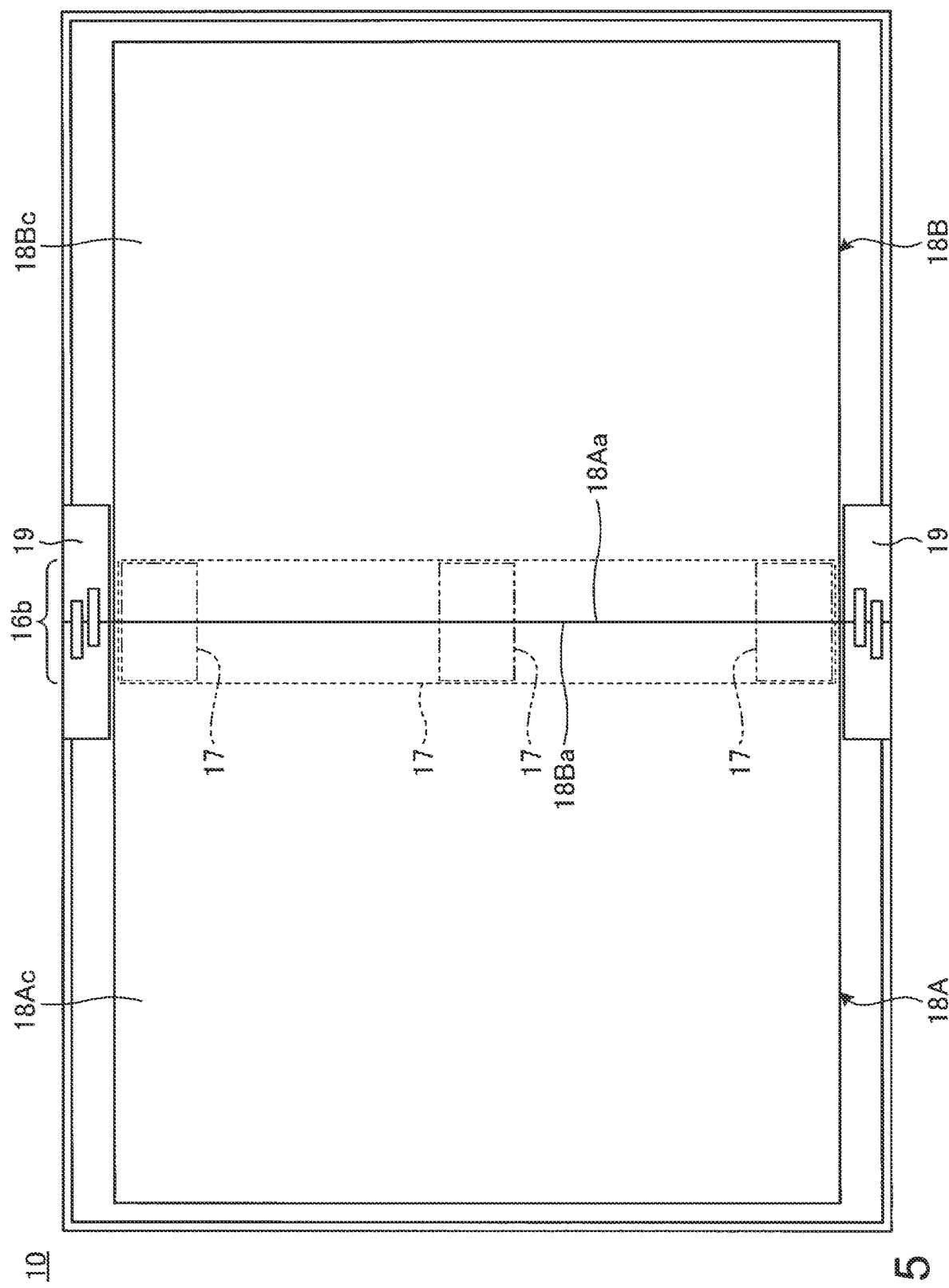
FIG. 5 is a plan view schematically showing the internal structure of the portable information device.

Subsequently, a configuration example of the magnet 17 is described. FIG. 4A is a cross-sectional side view schematically showing a configuration of the display 16, the magnet 17, the adhesive member 26, and the support plates 18A and 18B when in the operable form. FIG. 4B is a cross-sectional side view schematically showing a configuration of the display 16, the magnet 17, the adhesive member 26, and the support plates 18A and 18B when in the storage form. FIG. 5 is a plan view schematically showing the internal structure of the portable information device 10, and is a diagram of the portable information device 10 shown in FIG. 2 from which the display 16 and the bezel member 23 are omitted.

The magnet 17 is a permanent magnet that can attract the sheet-like member 16*d* that is a magnetic body. The magnet 17 is disposed in a position that overlaps with the folding area 16*b* of the display 16. The folding area 16*b* is a portion of the display 16 that is curved into an arc-like shape when the chassis members 12A and 12B and the support plates 18A and 18B are folded (see FIG. 4B). In the configuration example shown in FIGS. 4A and 4B, the magnet 17 includes a pair of right and left magnets, and the magnets 17 are provided on respective back surfaces 18Ab and 18Bb of the support plates 18A and 18B. The magnets 17 are disposed on respective first-edge-side ends (ends on the side of the first edges 18Aa and 18Ba) of the back surfaces 18Ab and 18Bb. Instead of the magnets 17, for example, one magnet into which the right and left magnets 17 and 17 in FIG. 4A are integrated may be used. In this case, one end of this one magnet only has to be fixed to one support plate 18A (18B) and have a length extending over the other support plate 18B (18A).

When in the operable form shown in FIG. 4A, the magnets 17 are located below the folding area 16*b*, and are adjacent to each other across the folding center C. At this time, the magnets 17 are located closest to the sheet-like member 16*d*. When in the storage form shown in FIG. 4B, the magnets 17 are separated from each other in accordance with separation of the support plates 18A and 18B, and are each located at a longer distance from the sheet-like member 16*d* than when in the operable form.

As indicated by a broken line in FIG. 5, the magnets are disposed, for example, like a belt along the Y direction within an area that overlaps with the folding area 16*b*. As indicated by an alternate long and two short dashes line in FIG. 5, the magnets 17 may be disposed on both Y-direction ends of the area that overlaps with the folding area 16*b*. In this case, an additional magnet 17 may be disposed in the middle of the area in the Y direction.

Figure 6:
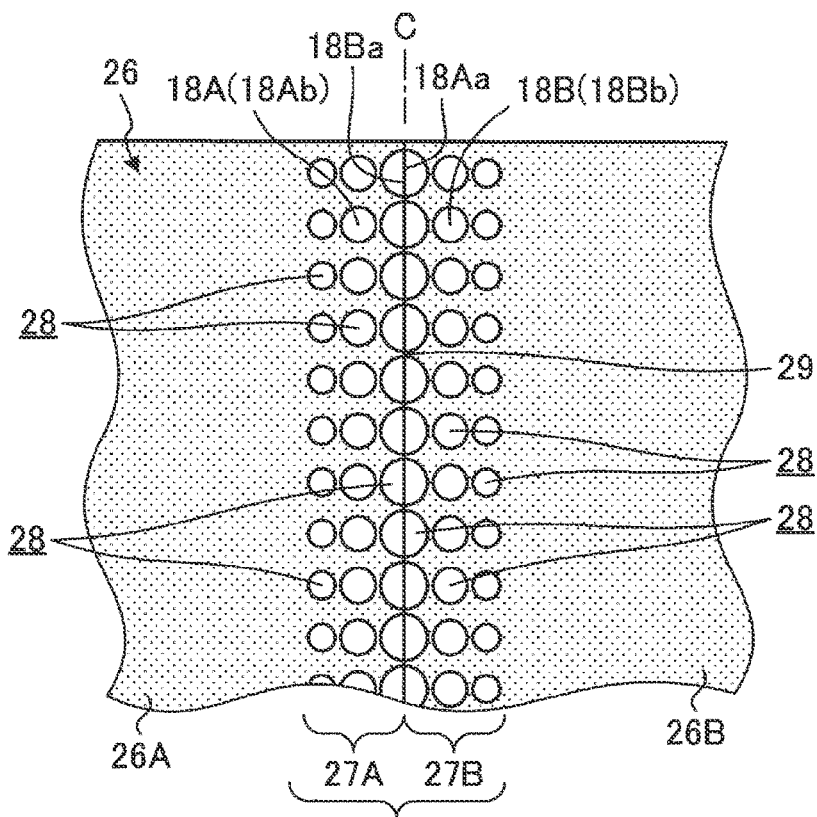
FIG. 6 is an enlarged plan view of a portion of the adhesive member provided on respective front surfaces of the support plates.

Subsequently, a configuration example of the adhesive member 26 is described. FIG. 6 is an enlarged plan view of a portion of the adhesive member 26 provided on the front surfaces 18Ac and 18Bc of the support plates 18A and 18B.

As shown in FIGS. 4A and 4B, the adhesive member 26 fastens the back surface 16a of the display 16 and the front surfaces 18Ac and 18Bc of the support plates 18A and 18B together. The adhesive member 26 is, for example, double-sided tape such as pressure sensitive adhesive (PSA) or optical clear adhesive (OCA). The adhesive member 26 has a thickness of, for example, about 10 μm to 30 μm. It is to be noted that the adhesive member here means a member that fastens two substances together. Besides double-sided tape formed into a tape, the concept of the adhesive member includes, for example, an adhesive that is applied in the same manner as double-sided tape.

As shown in FIGS. 4A, 4B, and 6, the adhesive member 26 includes a first adhesive section 26A, a second adhesive section 26B, and a weak adhesive section 27.

The first adhesive section 26A adheres to the front surface 18Ac of the first support plate 18A and about half the area of the back surface 16a of the display 16, which overlaps the front surface 18Ab, and fastens them together. The second adhesive section 26B adheres to the front surface 18Bc of the second support plate 18B and about half the area of the back surface 16a of the display 16, which overlaps the front surface 18Bb, and fastens them together. The first adhesive section 26A and the second adhesive section 26B are provided on the left and right sides across the weak adhesive section 27.

The weak adhesive section 27 is provided so as to straddle the folding center C, and extends like a belt along the Y direction. The weak adhesive section 27 is a section having a lower adhesive force than the adhesive sections 26A and 26B. The weak adhesive section 27 is provided at least over an area that overlaps with the folding area 16b of the display 16. The weak adhesive section 27 may be provided over a slightly larger area than the folding area 16b.

The weak adhesive section 27 includes a first area 27A adhering to the first support plate 18A and a second area 27B adhering to the second support plate 18B with reference to a boundary (the folding center C) between the support plates 18A and 18B. The areas 27A and 27B each have a plurality of holes 28 arranged along the area that overlaps with the folding area 16b of the display 16. Each hole 28 is a circular area that is not provided with the adhesive member 26. The shape of the holes 28 can be changed appropriately.

In the configuration example shown in FIG. 6, the holes 28 are formed into a bilaterally symmetric pattern with respect to the folding center C. Specifically, the holes 28 are a plurality of sets of five circular holes 28 aligned in the X direction, and the center hole 28 of each set that overlaps with the folding center C has a largest diameter. The first area 31A and the second area 31B share these largest-diameter holes 28 half-and-half in the X direction. The largest-diameter holes 28, which are arranged adjacent in the Y direction, are each divided into right and left portions by a cut 29. That is, the cut 29 along the folding center C divides the first area 31A and the second area 31B. The shape and arrangement of the holes 28 can be changed appropriately.

The weak adhesive section 27 includes the plurality of holes 28, and thus is lower in adhesive force per unit area than the adhesive sections 26A and 26B. In other words, the adhesive sections 26A and 26B are not provided with the holes 28, and thus are higher in adhesive force per unit area than the weak adhesive section 27. To reduce use of the adhesive member 26, the adhesive sections 26A and 26B may have a portion with no adhesive applied in some degree; however, the percentage of the portion with no adhesive applied per unit area is lower than at least the weak adhesive section 27. The weak adhesive section 27 can be easily formed, for example, by applying the adhesive member 26 onto the support plates 18A and 18B with masking tape (not shown) formed into the shape of the holes 28 put thereon and removing the masking tape to peel off a portion of the adhesive member 26 corresponding to the masking tape.

The back surface 16a of the display 16 in the present embodiment is provided with a covering film made of silicone. On the other hand, the support plates 18A and 18B, including their front surfaces 18Ac and 18Bc, are formed of a fiber-reinforced resin plate. Thus, the adhesive member 26 formed of, for example, the above-described PSA or OCA adheres more firmly to the support plates 18A and 18B than to the display 16. As a result, the weak adhesive section 27 having a lower adhesive force than the adhesive sections 26A and 26B adheres to the support plates 18A and 18B with sort of a high adhesive force. On the other hand, the weak adhesive section 27 adheres to the display 16 with a low adhesive force. Thus, in a case where the weak adhesive section 27 is subjected to a detachment force, the weak adhesive section 27 detaches itself from the display 16 prior to the support plates 18A and 18B.

Figure 7:
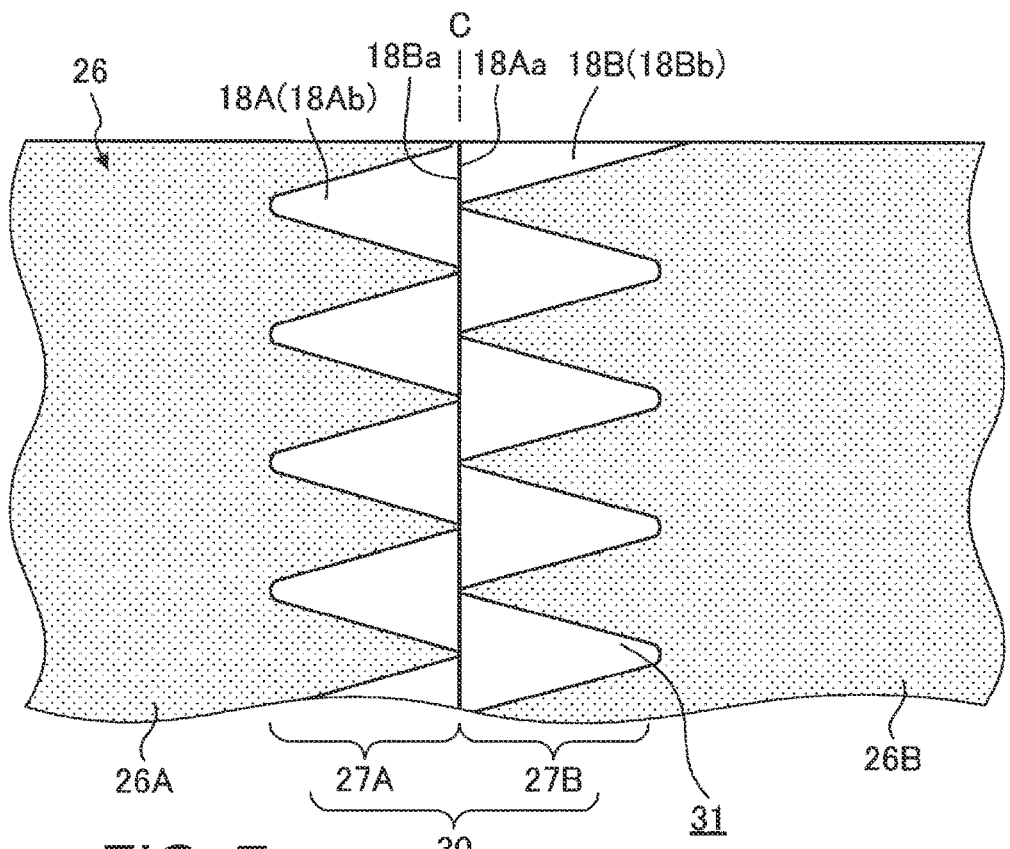
FIG. 7 is an enlarged plan view of a portion of the adhesive member including a weak adhesive section according to a modification example.

The configuration of the weak adhesive section 27 is not limited. For example, as shown in FIG. 7, the weak adhesive section 27 may be a weak adhesive section 30 having a wavy shape. The weak adhesive section 30 includes the first area 27A and the second area 27B as with the weak adhesive section 27; however, the areas 27A and 27B of the weak adhesive section 30 have a different shape from those of the weak adhesive section 27. That is, the areas 27A and 27B of the weak adhesive section 30 have a wavy shape extending along the folding center C. Respective wavy shapes of the areas 27A and 27B are shifted in phase, for example, by 0.5 periods and face each other through a gap 31 between them. The gap 31 is an area between the first area 27A and the second area 27B in which the adhesive member 26 is not provided. Therefore, the weak adhesive section 30 has the gap 31, and thus is lower in adhesive force per unit area than the adhesive sections 26A and 26B.

The weak adhesive sections 27 and 30 may be configured to have an adhesive force reduced by covering a portion of their adhesive surface with a masking material, such as masking tape. Furthermore, instead of the configuration using the holes 28 or a masking material or the like, a weak adhesive section may be formed in such a manner that the adhesive member 26 uses an adhesive having lower adhesiveness than the adhesive sections 26A and 26B. Moreover, a weak adhesive section of the adhesive member 26 may be formed in such a manner that the adhesive sections 26A and 26B and the weak adhesive section are all uniformly formed of the same adhesive, and, of the back surface 16a of the display 16 or the front surfaces 18Ac and 18Bc of the support plates 18A and 18B, a portion corresponding to the folding area 16b is subjected to surface treatment such as coating that reduces the adhesive force of the adhesive member 26.

Subsequently, the folding motion of the portable information device 10 from the operable form to the storage form is described.

When the portable information device 10 is in the operable form shown in FIG. 2, as shown in FIG. 4A, respective end surfaces of the first edges 18Aa and 18Ba are in contact with each other, and the support plates 18A and 18B form one plate. In this state, the adhesive sections 26A and 26B of the adhesive member 26 adhere to the support plates 18A and 18B and the display 16 over a large area. The weak adhesive section 27 (30) of the adhesive member 26 adheres to a portion around the first edges 18Aa and 18Ba of the tabular support plates 18A and 18B and the folding area 16*b* of the display 16 that is opened and forms one plate. At this time, the magnet 17 is disposed in a position closest to the sheet-like member 16*d*. Thus, the folding area 16*b* of the display 16 is attracted to the side of the support plates 18A and 18B by attraction of the magnet 17, and is pressed against the front surfaces 18Ac and 18Bc (see arrows M in FIG. 4A). That is, in a case of this configuration example, the support plates 18A and 18B need to be made of a material that allows a magnetic force of the magnet 17 to be transmitted.

In this form, substantially the entire surface of the display 16 including the folding area 16*b* is securely fastened onto the support plates 18A and 18B by the magnetic force of the magnet 17. This suppresses the occurrence of creases or uplift in the display 16 including the folding area 16*b* and its surrounding area. As a result, the portable information device 10 secures the quality of external appearance and the visibility of the display 16 when in the operable form. As described above, the magnet 17 is disposed at least around both ends of the folding area 16*b* in the Y direction. Thus, it is possible to certainly suppress the occurrence of creases, etc. in the both Y-direction ends of the folding area 16*b* of the display 16 where creases and uplift are likely to be conspicuous. Furthermore, the adhesive member 26 includes the weak adhesive section 27 (30) in an area that overlaps with the folding area 16*b*. Thus, the occurrence of creases, etc. in the folding area 16*b* of the display 16 is more certainly suppressed by the adhesive action of the weak adhesive section 27 (30). In other words, in this configuration example, the adhesive member 26 includes the weak adhesive section 27 or the like, and therefore the occurrence of creases, etc. can be suppressed even if the attraction effect of the magnet 17 is set to low. Accordingly, it is possible to make the magnet 17 smaller and thinner.

Next, when the portable information device 10 is folded from the operable form to the storage form, as shown in FIG. 4B, the weak adhesive section 27 of the adhesive member 26 detaches itself from the back surface 16*a* of the display 16. That is, the adhesive member 26 is located on the outer side than the front surface 16*c* of the display 16 on which the central axis of turning of the hinge mechanisms 19 is located, and therefore is subjected to a pulling force caused by a turning radius difference when the display 16 is folded. Thus, the weak adhesive section 27 that is provided for the folding area 16*b* and has a lower adhesive force than the other section (the adhesive sections 26A and 26B) is subjected to a force to detach itself from the front surfaces 18Ac and 18Bc of the support plates 18A and 18B or the back surface 16*a* of the display 16. At this time, the adhesive force on the back surface 16*a* of the display 16 formed of silicone is low relative to the adhesive force on the front surfaces 18Ac and 18Bc of the support plates 18A and 18B. Therefore, the weak adhesive section 27 detaches itself from the display 16, and remains on the support plates 18A and 18B.

At the same time, the first edges 18Aa and 18Ba of the support plates 18A and 18B are separated from each other. At this time, the magnets 17 are separated from each other in accordance with the separation of the support plates 18A and 18B, and are disposed in positions largely separated from the sheet-like member 16*d*. Thus, the magnets 17 do not attract the sheet-like member 16*d* when the portable information device 10 is in the storage form. As a result, when the portable information device 10 is in the storage form, the first adhesive section 26A and the first area 27A of the weak adhesive section 27 remain on the first support plate 18A, and the second adhesive section 26B and the second area 27B remain on the second support plate 18B (see FIG. 4B). Furthermore, when the portable information device 10 is in this form, the display 16 is prevented from being adversely affected by the magnetic force of the magnet 17.

In this way, when the portable information device 10 is folded in the storage form, the weak adhesive section 27 detaches itself from the display 16, and at the same time, the attraction of the magnet 17 does not work. As a result, the display 16 is smoothly folded into the storage form. Furthermore, the display 16 is prevented from being subjected to an excessive load or a folding force of a curvature beyond a design condition when it is folded. Moreover, when the portable information device 10 is in the operable form, neither creases nor uplift occurs in the folding area 16*b* of the display 16, and therefore, it is possible to suppress the occurrence of failure of the display 16 when starting a folding motion caused by such creases or uplift being subjected to a compressive force, and thereby the display 16 being further lifted up and buckling.

Next, when the portable information device 10 is opened from the storage form to the operable form, as shown in FIG. 4A, the weak adhesive section 27 is pressed between the display 16 and the support plates 18A and 18B, and again adheres to the both. At the same time, the attraction of the magnet 17 attracts the folding area 16*b* to the side of the support plates 18A and 18B. Thus, substantially the entire surface of the display 16 including the folding area 16*b* is again fastened onto the support plates 18A and 18B, and this suppresses the occurrence of creases or uplift in the display 16 including the folding area 16*b* and its surrounding area.

The weak adhesive section 27 (30) may be configured to detach itself from the support plates 18A and 18B and remain on the display 16 when the portable information device 10 is folded. In this case, the material of the back surface 16*a* of the display 16 or the front surfaces 18Ac and 18Bc of the support plates 18A and 18B only has to be changed to a different material from the configuration example shown in FIGS. 4A and 4B.

The shape and disposition of the magnets 17 can be appropriately changed as long as the magnets 17 can attract the folding area 16*b* of the display 16 to the side of the support plates 18A and 18B when the portable information device 10 is in the operable form. For example, FIG. 4A illustrates the configuration in which the magnets 17 are disposed in the area that covers the folding area 16*b*; however, the magnets 17 may be disposed in only a portion of the area that overlaps with the folding area 16*b*. The magnet 17 may be disposed in only either one of the support plates 18A and 18B.

Figure 8:
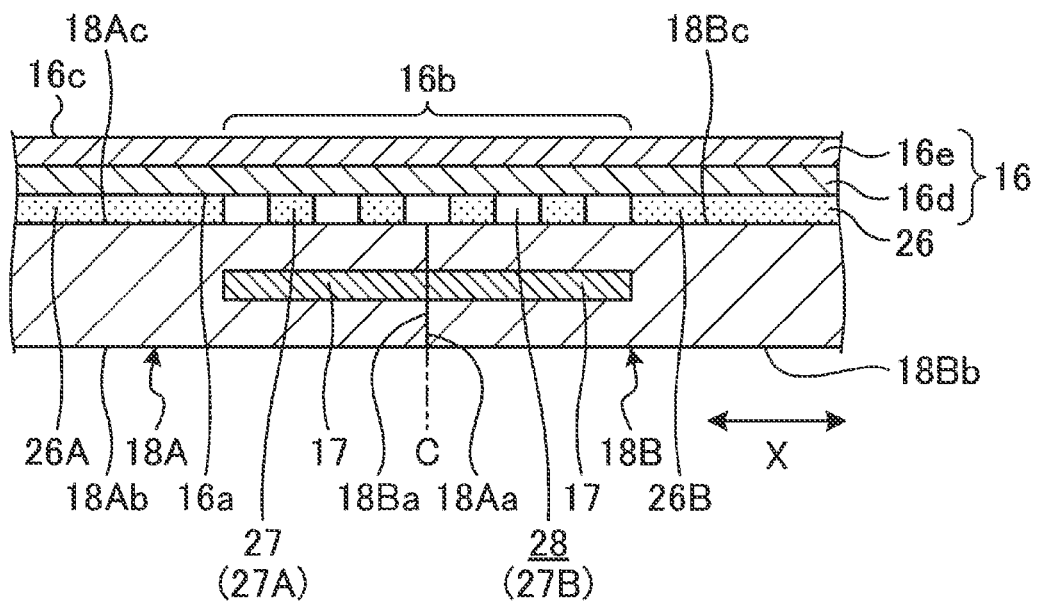
FIG. 8 is a cross-sectional side view schematically showing an installation structure of the magnet in a first modification example.

As shown in FIG. 8, the magnets 17 may be embedded inside the support plates 18A and 18B. Then, the magnets 17 do not affect the thickness of the portable information device 10, and the portable information device 10 can be made more thinner. Furthermore, the magnets 17 do not project from the back surfaces 18Ab and 18Bb, which improves the degree of freedom of installation of an electronic component provided below the back surfaces 18Ab and 18Bb.

Figure 9:
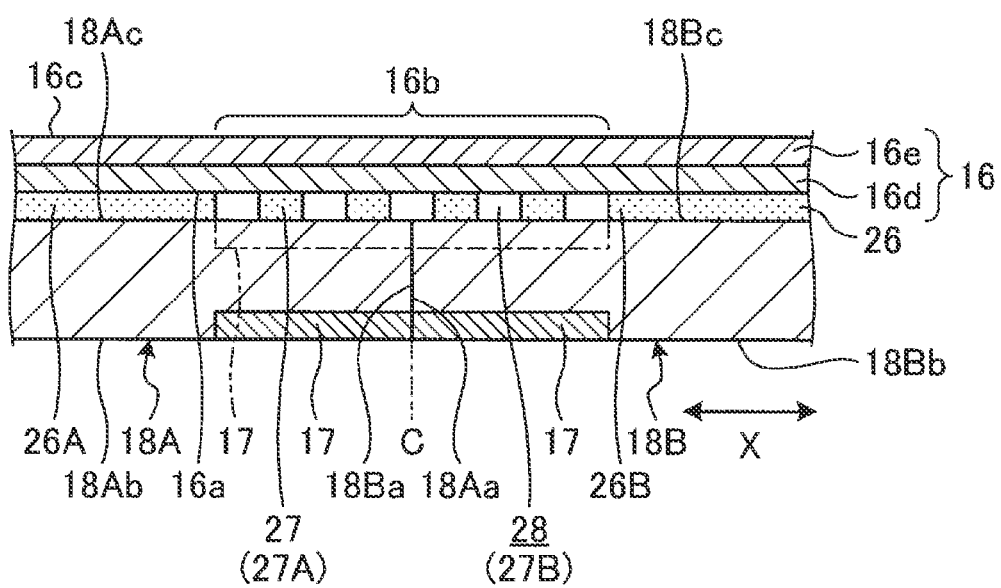
FIG. 9 is a cross-sectional side view schematically showing an installation structure of the magnet in a second modification example.

As shown in FIG. 9, the magnets 17 may be disposed in recessed portions formed on the back surfaces 18Ab and 18Bb of the support plates 18A and 18B. Thus, the magnets 17 are embedded in the back surfaces 18Ab and 18Bb of the support plates 18A and 18B. As indicated by an alternate long and two short dashes line in FIG. 9, the magnets 17 may be embedded in recessed portions formed on the front surfaces 18Ac and 18Bc of the support plates 18A and 18B.

By disposing the magnets 17 in the recessed portions formed on the back surfaces 18Ab and 18Bb or the front surfaces 18Ac and 18Bc in this way, the work of installing the magnets 17 can be made easier than a configuration example shown in FIG. 8. Only a portion of the magnets 17 may be embedded in the support plates 18A and 18B.

As indicated by an alternate long and two short dashes line in FIG. 3, the magnets 17 may be provided on the surface of the spine member 14. As shown in FIG. 3, the spine member 14 is disposed so as to cover the folding center C when the portable information device 10 is in the operable form, and thus the magnets 17 only have to be provided in a portion that covers this folding center C. The magnets 17 may be embedded in the spine member 14. For example, in a case where the spine member 14 is not provided, the magnets 17 may be provided on the inner surfaces 12Ac and 12Bc of the chassis members 12A and 12B.

Figure 10:
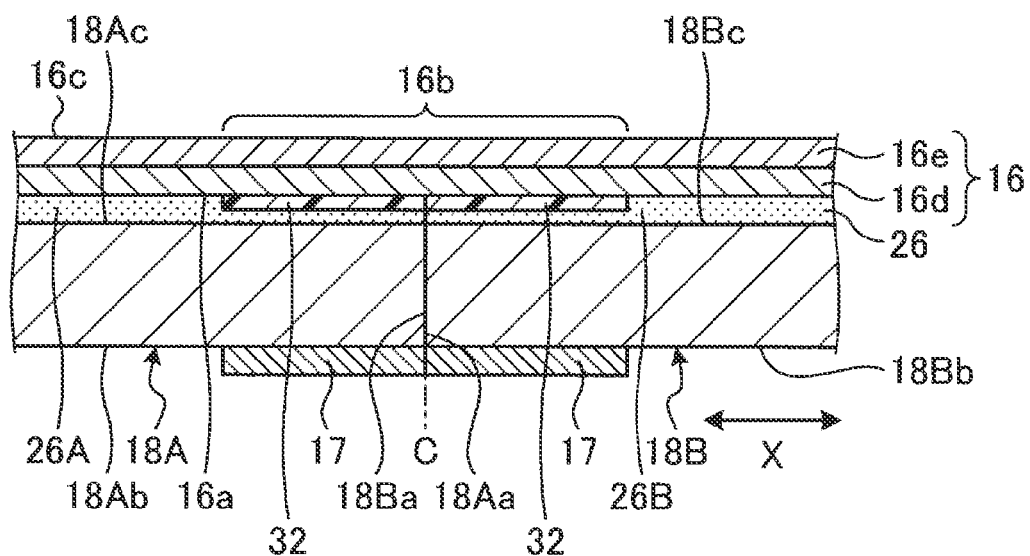
FIG. 10 is a schematic cross-sectional side view of a configuration example of the adhesive member including non-adhesive portions instead of the weak adhesive section.

Instead of the weak adhesive section 27 (30), one side or both sides of an area of the adhesive surface of the adhesive member 26 that overlaps with the folding area 16b may be configured to have no adhesive force. For example, non-adhesive portions 32 shown in FIG. 10 includes resin film, such as masking tape, provided on one side of the adhesive member 26. That is, the weak adhesive section 27 (30) has a non-adhesive portion 29 (31), and thus the adhesive force of the adhesive surface is reduced. On the other hand, one side of the adhesive surface of the non-adhesive portions 32 that overlaps with the folding area 16b is covered with the resin film or the like, and thus has no adhesive force. The pair of right and left non-adhesive portions 32 is provided across the folding center C, and divides into the first adhesive section 26A side and the second adhesive section 26B side. The non-adhesive portions 32 are in contact with the back surface 16a of the display 16 when the portable information device 10 is in the operable form, and are separated from the back surface 16a when the portable information device 10 is in the storage form. Also in a configuration in which such non-adhesive portions 32 are provided, when the portable information device 10 is in the operable form shown in FIG. 8, the folding area 16b of the display 16 is attracted to the side of the support plates 18A and 18B by the attraction of the magnets 17. As a result, the occurrence of creases or uplift in the display 16 including the folding area 16b and its surrounding area is suppressed.

Figure 11:
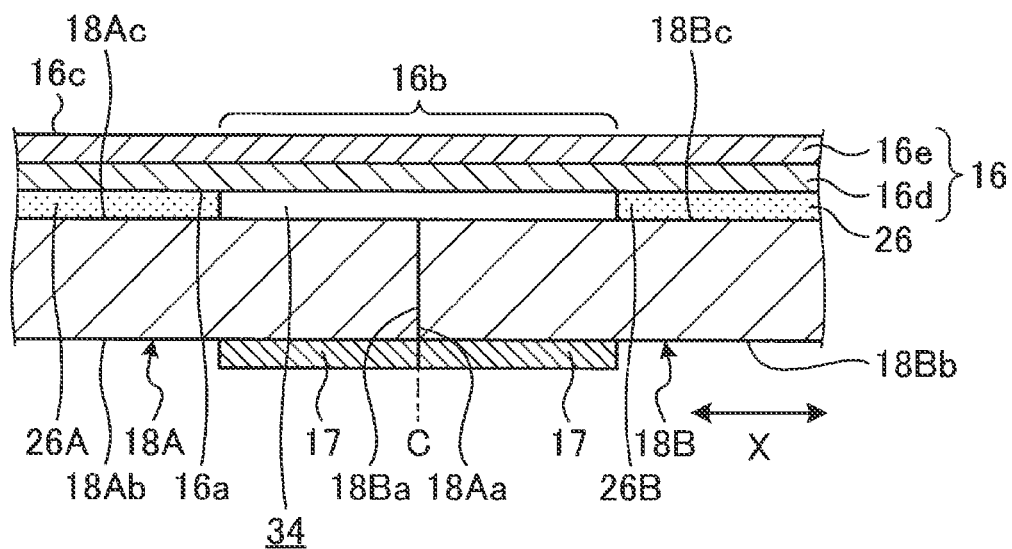
FIG. 11 is a schematic cross-sectional side view of a configuration example of the adhesive member including another non-adhesive section instead of the weak adhesive section.

Instead of the weak adhesive section 27 (30) or the non-adhesive portions 32, an area of the adhesive member 26 that overlaps with the folding area 16b may be provided with no adhesive as shown in FIG. 11. The adhesive member 26 shown in FIG. 11 includes the first adhesive section 26A, the second adhesive section 26B, and a section (a non-adhesive section 34) provided with no adhesive between the adhesive sections 26A and 26B. Also in a configuration in which such a non-adhesive section 34 is provided, when the portable information device 10 is in the operable form shown in FIG. 9, the folding area 16b of the display 16 is attracted to the side of the support plates 18A and 18B by the attraction of the magnets 17. As a result, the occurrence of creases or uplift in the display 16 including the folding area 16b and its surrounding area is suppressed. It is to be noted that in cases of the configuration examples shown in FIGS. 10 and 11, the area of the adhesive member 26 that overlaps with the folding area 16b does not have to be detachable from and re-adherable to the back surface 16a of the display 16 or the like. Thus, the adhesive member 26 in this case may be formed of an adhesive incapable of re-adhesion.

It is to be noted that needless to say, the present invention is not limited to the above-described embodiment, and various modifications may be made without departing from the scope of the invention.

In the above, there is described the portable information device 10 that can be folded in two like a book; however, the present invention can be applied to various configurations other than the configuration in which chassis members having the same shape are folded in two, for example, a French-door configuration in which small chassis members are foldably connected to right and left edges of a large chassis member, an S-type folding configuration in which chassis members that differ in folding direction from each other are connected to right and left edges of one chassis member, a J-type folding configuration in which a small chassis member is foldably connected to either one of right and left edges of a large chassis member, etc., and the number of chassis members connected may be four or more.

The invention claimed is:

1. A portable information device comprising:
    a first chassis member;
    a second chassis member foldably connected to the first chassis member;
    a first support plate fastened to the first chassis member;
    a second support plate fastened to the second chassis member and located adjacent to the first support plate;
    a display having a back surface that is supported on respective front surfaces of the first support plate and the second support plate, the display including a folding area that is folded when the first chassis member and the second chassis member are folded towards one another; and
    an adhesive member that adheres to the respective front surfaces of the first support plate and the second support plate and to the back surface of the display, and fastens the first support plate and the second support plate and the display together,
    wherein an area of the adhesive member that overlaps with at least the folding area includes a weak adhesive section in which an adhesive force of the adhesive member with the respective front surfaces of the first support plate and the second support plate, and with the back surface of the display, is lower than another section of the adhesive member or a non-adhesive section of the adhesive member that does not adhere to at least either the respective front surfaces of the first support plate and the second support plate or the back surface of the display,
    the display includes a magnetic body that overlaps with at least the folding area, and
    the portable information device further includes a magnet adjacent the back surface of the display and in a position that overlaps with the folding area, the magnet being able to attract the magnetic body.

2. The portable information device according to claim 1, wherein
    when the portable information device is in an operable form in which the first chassis member and the second chassis member are on substantially a same plane, the magnet attracts the magnetic body and pulls the display to respective sides of the first support plate and the second support plate, and
    when the portable information device is in a storage form in which the first chassis member and the second chassis member are folded until the first chassis member and the second chassis member come face-to-face, and the display is folded, the magnet is disposed in a position farther away from the magnetic body than when the portable information device is in the operable form.

3. The portable information device according to claim 1, wherein the magnet is disposed on a back surface of at least one of the first support plate and the second support plate.

4. The portable information device according to claim 1, wherein at least a portion of the magnet is embedded in at least one of the first support plate and the second support plate.

5. The portable information device according to claim 2, further comprising a spine member that stretches between an inner surface of the first chassis member and an inner surface of the second chassis member so as to cover a gap formed between respective adjacent first edges of the first chassis member and the second chassis member when the portable information device is in the storage form, wherein one end of the spine member is non-slidably fixed to the inner surface of the second chassis member so that the spine member slides in a direction from the second chassis member to the first chassis member along the inner surface of the first chassis member, and the magnet is provided on the spine member.

6. The portable information device according to any one of claim 1, wherein the magnetic body is a rolled metallic sheet-like member.

7. The portable information device according to claim 6, wherein the sheet-like member is made of stainless steel.

8. The portable information device according to claim 6, wherein the sheet-like member extends over an entire surface of the display.

9. The portable information device according to claim 1, wherein the magnet is disposed in a position near at least both ends of the folding area in a longitudinal direction.

* * * * *